United States Patent
Kishi

(10) Patent No.: US 8,921,966 B2
(45) Date of Patent: Dec. 30, 2014

(54) IMAGE SENSOR AND MANUFACTURING METHOD THEREOF

(75) Inventor: Takafumi Kishi, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 114 days.

(21) Appl. No.: 13/145,032

(22) PCT Filed: Mar. 10, 2010

(86) PCT No.: PCT/JP2010/054468
§ 371 (c)(1),
(2), (4) Date: Jul. 18, 2011

(87) PCT Pub. No.: WO2010/113634
PCT Pub. Date: Oct. 7, 2010

(65) Prior Publication Data
US 2012/0012964 A1    Jan. 19, 2012

(30) Foreign Application Priority Data

Apr. 2, 2009  (JP) .................. 2009-090485

(51) Int. Cl.
*H01L 27/146* (2006.01)

(52) U.S. Cl.
CPC .... *H01L 27/14685* (2013.01); *H01L 27/14623* (2013.01); *H01L 27/14625* (2013.01)
USPC  257/435; 257/432; 257/E27.13; 257/E31.122; 438/31; 438/70; 438/73

(58) Field of Classification Search
CPC ................................................. H01L 27/14623
USPC ................ 257/432, 435, E32.119, E31.122, 257/E31.127; 438/31, 69
See application file for complete search history.

(56) References Cited

U.S. PATENT DOCUMENTS

2001/0039061 A1   11/2001  Suzuki et al.
2009/0189236 A1*   7/2009  Hayashi et al. ............... 257/432

FOREIGN PATENT DOCUMENTS

| JP | 04-073532 | A | 3/1992 | |
| JP | 2005-175930 | A | 6/2005 | |
| JP | 2006-128383 | * | 5/2006 | ............. H01L 27/14 |
| JP | 2007-141873 | * | 6/2007 | ............. H01L 27/14 |
| JP | 2007-141873 | A | 6/2007 | |
| JP | 2009-267062 | A | 11/2009 | |

OTHER PUBLICATIONS

May 27, 2013 Chinese Office Action that issued in Chinese Patent Application No. 201080015737.0.

* cited by examiner

*Primary Examiner* — Benjamin Sandvik
*Assistant Examiner* — Farid Khan
(74) *Attorney, Agent, or Firm* — Cowan, Liebowitz & Latman, P.C.

(57) ABSTRACT

An image sensor includes: a photoelectric conversion pixel having a photoelectric conversion element that performs photoelectric conversion, and a light guide formed of a first material in an interlayer insulation film above the photoelectric conversion element; and a light-shielded pixel having a photoelectric conversion element that performs photoelectric conversion, a light guide formed of a second material that is different from the first material in an interlayer insulation film above the photoelectric conversion element, and a light-shielding layer formed above the light guide.

10 Claims, 5 Drawing Sheets

F I G. 3A
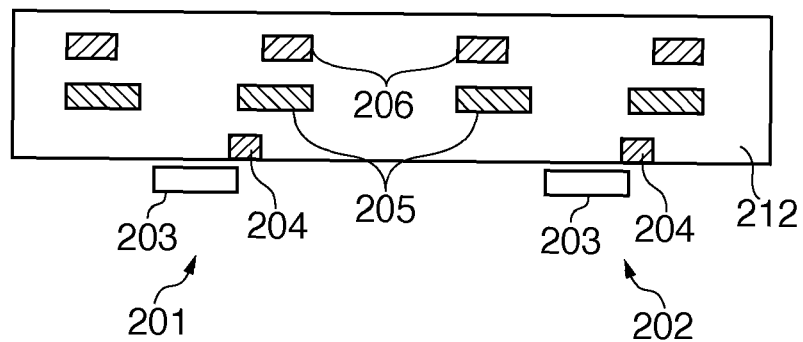
F I G. 3B
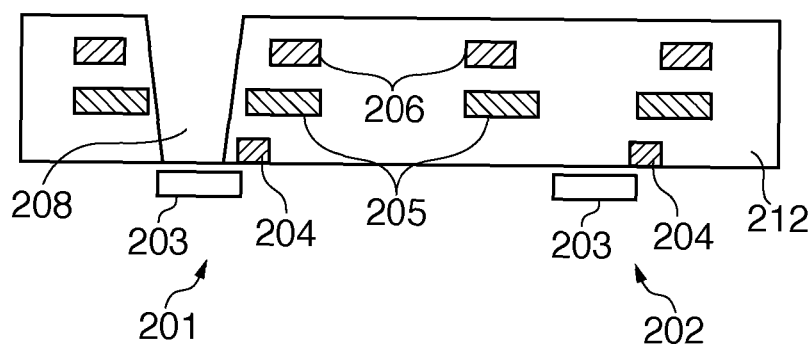
F I G. 3C
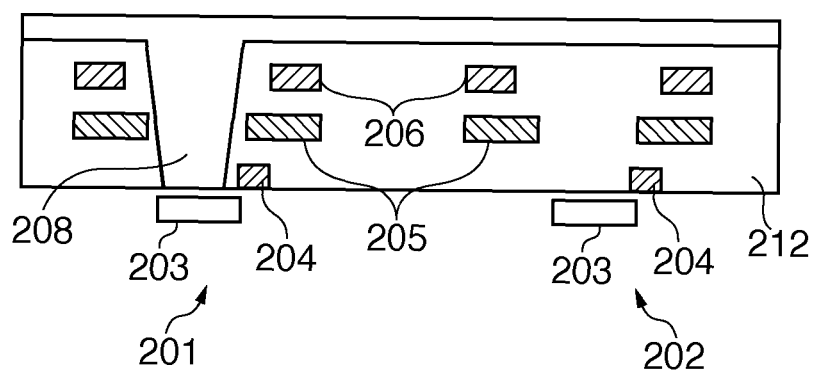

IMAGE SENSOR AND MANUFACTURING METHOD THEREOF

TECHNICAL FIELD

The present invention relates to the structure of image sensors.

BACKGROUND ART

Image capturing apparatuses such as digital cameras, digital video cameras, and so on, which use CCDs, CMOS APSs, and so on as their image sensors and record captured images, have been sold for some time. Such image sensors attempt to improve the image quality by increasing the number of pixels. For this reason, the surface area of each pixel for which the image sensor is configured has been decreasing year after year, and the surface area of the light-receiving section thereof has also decreased as a result. A decrease in the surface area of the light-receiving section also leads to a decrease in the sensitivity, thus an image sensor in which the light-collection characteristics are improved by providing a light guide for guiding light into the light-receiving section between the incident surface and the light-receiving section has been proposed (see Japanese Patent Laid-Open No. 4-73532).

Incidentally, image sensors are configured with multiple pixels being arrayed two-dimensionally, and these pixels include active pixels, whose light-receiving sections are open, and OB (optical black) pixels, which are shielded. It is desirable for such OB pixels to have the same characteristics as the active pixels, but it is known that a phenomenon called an "OB level difference" occurs. That is, the OB pixels are shielded by a shielding member such as aluminum, which causes parasitic capacitance to arise between the photodiode and the shielding member; this in turn results in different surface levels between the active pixels in the OB pixels (see Japanese Patent Laid-Open No. 2005-175930).

With image sensors that have light guides as mentioned earlier, the OB pixels often do not have light guides, which is problematic in that OB level differences occur more easily. In order to solve this problem, an image sensor in which light guides are embedded in the OB pixels as well has been proposed (see Japanese Patent Laid-Open No. 2007-141873).

The technique disclosed in Japanese Patent Laid-Open No. 2007-141873 is a useful technique to eliminate OB level differences. However, because the size of the light guides for OB pixels and the size of the light guides for active pixels are different, there is nevertheless the possibility that a small degree of OB level difference will remain. Although Japanese Patent Laid-Open No. 2007-141873 does mention using the same shape for the light guides as a valid means to eliminate this small degree of remaining OB level difference, a detailed structure to realize such a means is not disclosed therein.

DISCLOSURE OF INVENTION

In light of the aforementioned problems, the present invention provides a structure for an image sensor that enables the reduction of OB level difference.

An image sensor according to a first aspect of the present invention includes: a photoelectric conversion pixel having a first photoelectric conversion element, a first wiring layer positioned above the first photoelectric conversion element, a first interlayer insulation film formed among the first wiring layer, and a first light guide formed of a first material in the first interlayer insulation film; and a light-shielded pixel having a second photoelectric conversion element, a second wiring layer positioned above the second photoelectric conversion element, a second interlayer insulation film formed among the second wiring layer, a second light guide formed of a second material that has different characteristics from the first material in the second interlayer insulation film, and a light-shielding layer, formed above the second light guide, that shields the second photoelectric conversion element and the second light guide.

Meanwhile, a manufacturing method according to a second aspect of the present invention is a manufacturing method for an image sensor, the image sensor including photoelectric conversion elements, multiple wiring layers, light guides formed in an interlayer insulation film that is among the multiple wiring layers, a light-shielding layer formed above the multiple wiring layers, a light-shielded pixel whose photoelectric conversion element is shielded by the light-shielding layer, and a photoelectric conversion pixel whose photoelectric conversion element is not shielded by the light-shielding layer, and the method including: a first step of forming the interlayer insulation film among the multiple wiring layers; a second step of forming the light guide in the interlayer insulation film of the light-shielded pixel after the first step; a third step of forming the light guide in the interlayer insulation film of the photoelectric conversion pixel after the second step; and a fourth step of forming the light-shielding layer on the light-shielded pixel and the photoelectric conversion pixel after the third step. Here, the light guide of the photoelectric conversion pixel is formed of a first material and the light guide of the light-shielded pixel is formed of a second material that has different characteristics from the first material.

Further features of the present invention will become apparent from the following description of exemplary embodiments with reference to the attached drawings.

BRIEF DESCRIPTION OF DRAWINGS

FIG. 3A is a diagram schematically illustrating a manufacturing method of an image sensor.

FIG. 3B is a diagram schematically illustrating a manufacturing method of an image sensor.

FIG. 3C is a diagram schematically illustrating a manufacturing method of an image sensor.

BEST MODE FOR CARRYING OUT THE INVENTION

Hereinafter, an embodiment of the present invention shall be described in detail with reference to the drawings.

Figure 1:
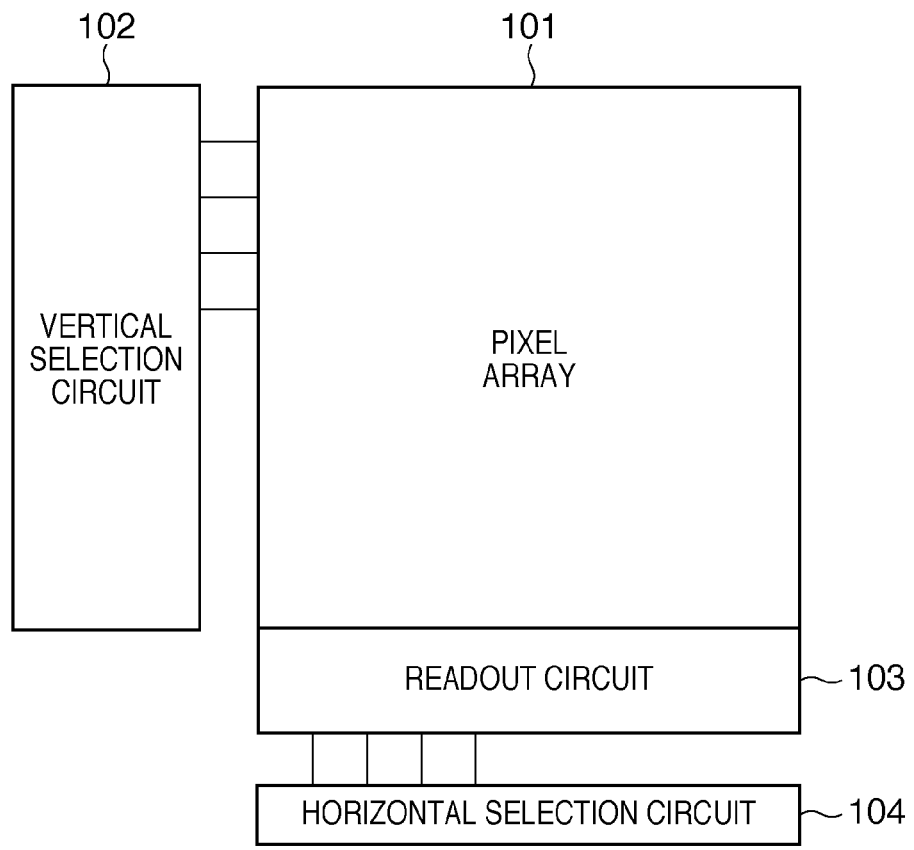
FIG. 1 is a diagram roughly illustrating the overall configuration of an image sensor according to an embodiment of the present invention.

FIG. 1 is a diagram illustrating the structure of an image sensor according to an embodiment of the present invention.

The image sensor in FIG. 1 includes a pixel array 101 in which pixels are arrayed two-dimensionally, a vertical selection circuit 102 that selects rows in the pixel array 101, and a horizontal selection circuit 104 that selects columns in the pixel array 101. The image sensor also includes a readout circuit 103 that reads out signals from pixels of the pixel array 101 that have been selected by the vertical selection circuit 102 and the horizontal selection circuit 104. Note that in addition to the constituent elements illustrated in FIG. 1, the image sensor also includes, for example, a timing generator that manages the timing of the vertical selection circuit 102, the horizontal selection circuit 104, and the readout circuit 103, a control circuit, and the like.

The vertical selection circuit 102 selects multiple rows of the pixel array 101 in order, whereas the horizontal selection circuit 104 selects multiple columns of the pixel array in order so as to select the multiple pixels of which the rows selected by the vertical selection circuit 102 are configured in order. The pixel array 101 is configured with multiple pixels in a two-dimensional array form, so as to provide a two-dimensional image.

Figure 2:
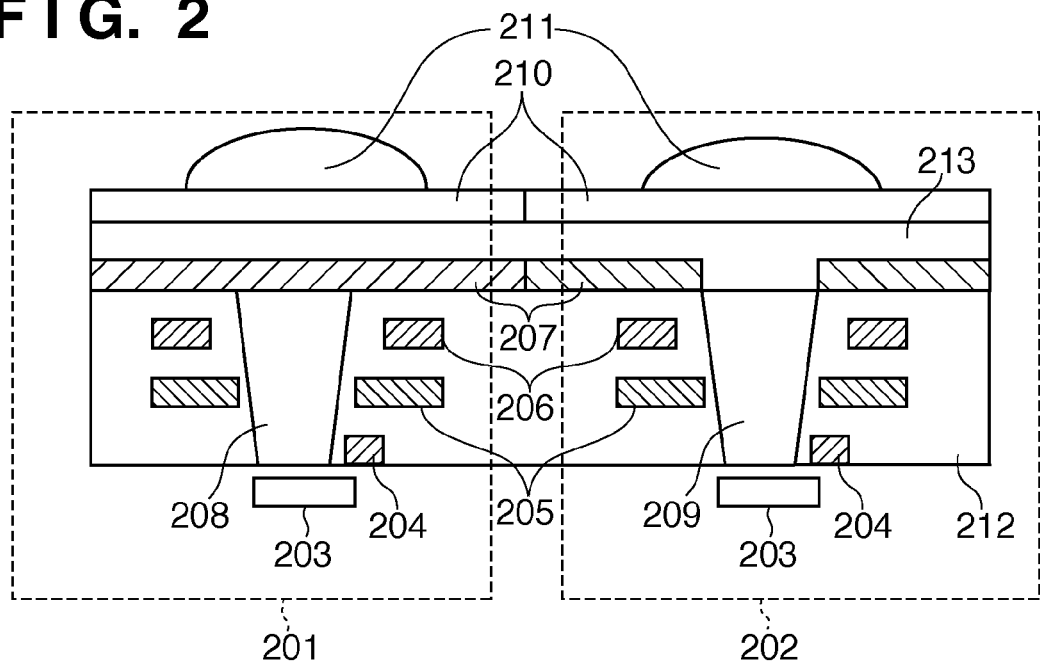
FIG. 2 is a diagram schematically illustrating the cross-sectional structure of a pixel in an image sensor.

FIG. 2 is a diagram schematically illustrating the cross-sectional structure of a pixel in the pixel array 101.

In FIG. 2, 201 indicates an OB pixel (light-shielded pixel) that is optically shielded by a shielding wiring layer 207 (a third wiring layer, mentioned later). 202 indicates an active pixel (a photoelectric conversion pixel). 203 indicates photodiodes (hereinafter, "PD") serving as a photoelectric conversion elements, and the photodiodes are provided within a semiconductor substrate for the OB pixel 201 and the active pixel 202 (a first photoelectric conversion element and a second photoelectric conversion element). 204 indicates a POLY wiring layer; 205 indicates a first wiring layer located above the PD 203; 206 indicates a second wiring layer; and 207 indicates the third wiring layer. With these multiple wiring layers, an electrical signal resulting from photoelectric conversion performed by the PD 203 is read out to the readout circuit 103, and the power supply/GND necessary for the readout is supplied as well. These multiple wiring layers are provided in the same manner for both the OB pixel and the active pixel (the first wiring layer and the second wiring layer). The first through third wiring layers 205, 206, and 207 are formed of aluminum, copper, or the like. The third wiring layer 207 is the wiring layer that is farthest from the PD 203, and in the OB pixel, the PD 203 is shielded by forming the third wiring layer 207 (light-shielding layer) across the entire surface thereof. On the other hand, in the active pixel 202, an opening portion is provided in the central portion of the third wiring layer 207 so that light can pass therethrough, and only the periphery thereof is shielded. Interlayer insulation films are formed between each of the layers 204, 205, 206, and 207 (a first interlayer insulation film and a second interlayer insulation film). An interlayer insulation film 212 is formed of a material having a low refraction index. For example, the interlayer insulation film 212 is formed of silicon oxide film (SiO2; a refraction index of 1.46), BPSG film (a refraction index of 1.46), or the like. 210 indicates a color filter layer; 211 indicates a microlens; and 213 indicates a protective film.

Light guides 208 and 209 are formed in the interlayer insulation films. The light guide 208 of the OB pixel 201 (a first light guide) and the light guide 209 of the active pixel 202 (a second light guide) are formed using materials that have different dielectric constants from each other (that is, materials having different characteristics). The light guide 209 of the active pixel 202 is configured of a material that has a higher refraction index than the interlayer insulating film (a first material). For example, the light guide 209 is formed of SiN (a refraction index of 2.0). With the OB pixel 201, the third wiring layer 207 is also located above the light guide 208, and therefore the parasitic capacitance between the PD 203 and the shielding wiring layer (third wiring layer) 207 is different from that of the active pixel 202. This difference is particularly noticeable in the case where SiN (a relative dielectric constant of approximately 7 to 9) is used for the light guides. Accordingly, the light guide 208 of the OB pixel 201 is formed of a material that has a lower refraction index than the light guide 209 of the active pixel 202 (a second material). SiN, whose composition differs from the light guide 209 and whose refraction index is lower, is optimal. However, other materials (for example, SiON (a relative dielectric constant of approximately 2.5)) may be used as well. Furthermore, the light guide 208 may be formed using multiple materials rather than a single material, based on the forms of the light guides 208 or 209. For example, in the case where SiN is used as the material of the light guide 208, the composition of the SiN can be changed partway, resulting in the use of two types of SiN having different dielectric constants.

A manufacturing method for the image sensor described thus far shall now be described based on FIGS. 3A to 3I.

Figure 3D:
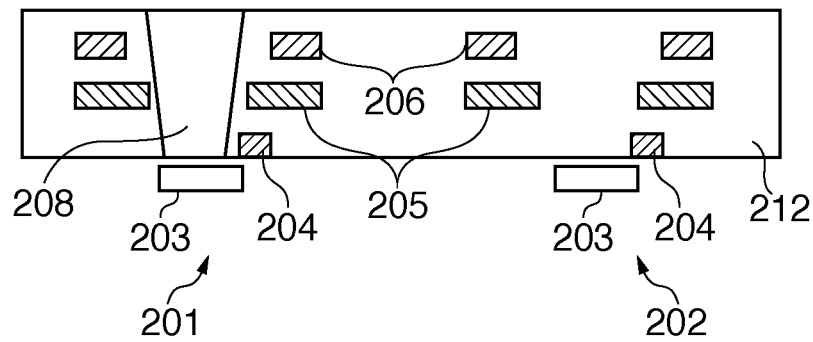
FIG. 3D is a diagram schematically illustrating a manufacturing method of an image sensor.

First, as shown in FIG. 3A, the interlayer insulation film 212 is formed so as to cover from the POLY wiring layer 204 to the second wiring their 206, in both the OB pixel 201 and the active pixel 202 (a first step). Next, as shown in FIG. 3B, a groove is formed using lithography and an etching process in the interlayer insulation film in the region of the OB pixel 201 in which the light guide 208 is to be formed. Then, as shown in FIG. 3C, an embedded material is accumulated within the light guide 208 using a method such as plasma CVD or the like (a second step). As described earlier, while it is desirable to use SiN having a composition with a low dielectric constant, SiON, a composite material, or the like may be used. Next, as shown in FIG. 3D, the extra SiN is removed from the areas aside from the light guide 208 using a method such as CMP, etchback, or the like.

Figure 3E:
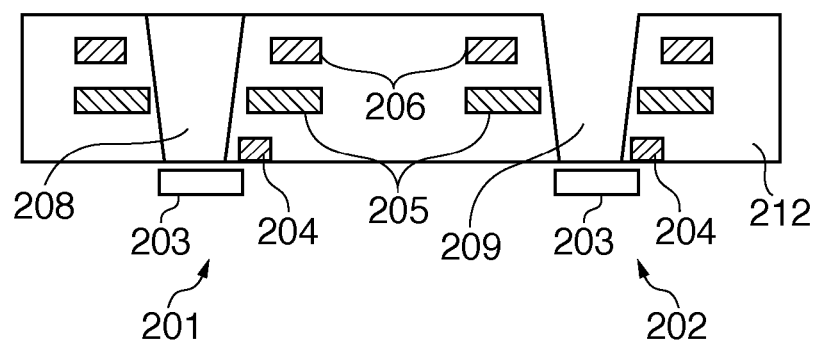
FIG. 3E is a diagram schematically illustrating a manufacturing method of an image sensor.
Figure 3F:
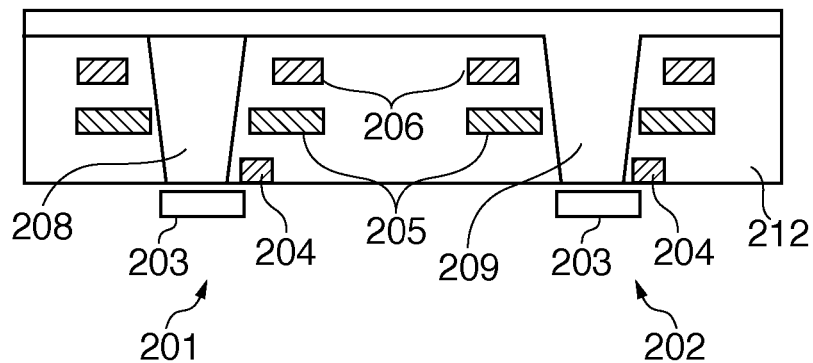
FIG. 3F is a diagram schematically illustrating a manufacturing method of an image sensor.
Figure 3G:
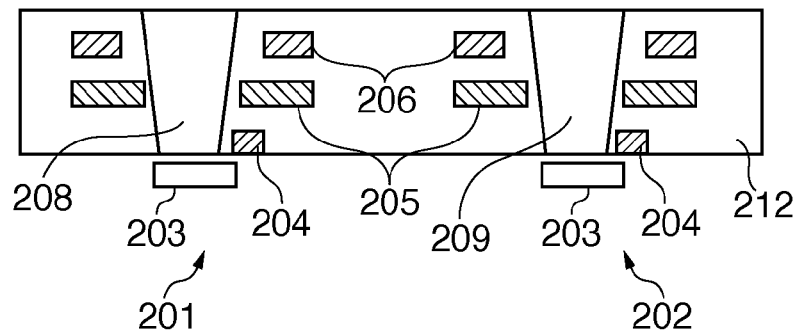
FIG. 3G is a diagram schematically illustrating a manufacturing method of an image sensor.

Next, as shown in FIG. 3E, a groove is formed using lithography and an etching process in the interlayer insulation film in the region of the active pixel 202 in which the light guide 209 is to be formed, in the same manner as the step shown in FIG. 3B. At this time, it is preferable to protect the light guide 208 using a resist or the like (not shown). Then, as shown in FIG. 3F, an embedded material is accumulated within the light guide 209 using a method such as plasma CVD or the like (a third step). A material that has a higher dielectric constant than the second material embedded in the light guide 208 is selected for the first material embedded in the light guide 209. SiN having a composition with a higher dielectric constant is desirable. Next, as shown in FIG. 3G, the extra SiN, the resist, and so on are removed from the areas aside from the light guides 208 and 209 using a method such as CMP, etchback, or the like.

Figure 3H:
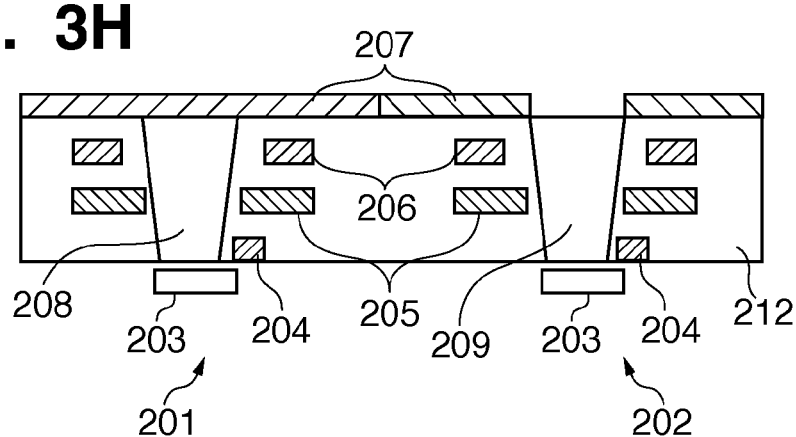
FIG. 3H is a diagram schematically illustrating a manufacturing method of an image sensor.
Figure 3I:
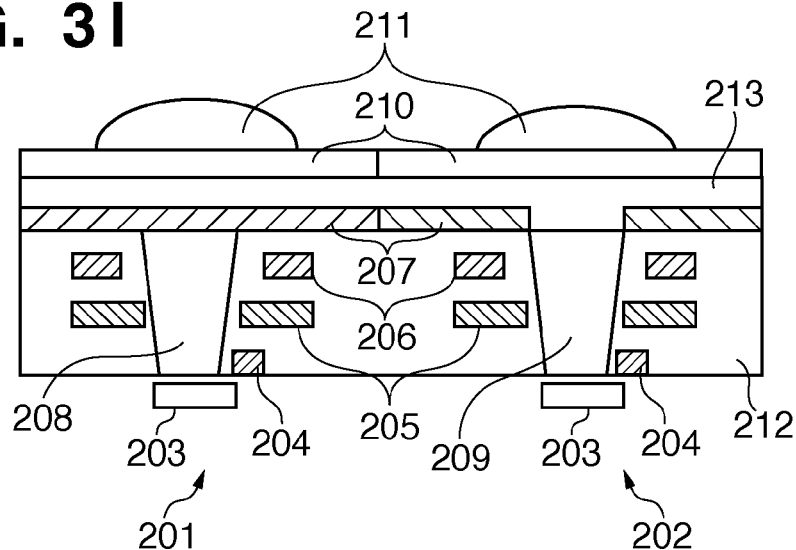
FIG. 3I is a diagram schematically illustrating a manufacturing method of an image sensor.

Next, as shown in FIG. 3H, the third wiring layer 207, which is the uppermost layer and serves as the light-shielding layer, is formed (a fourth step). Here, the uppermost third wiring layer 207 is formed across the entire surface of the OB pixel 201, and thus the OB pixel 201 is in a perpetually shielded state. Meanwhile, with the active pixel 202, the uppermost wiring layer is left open so as to allow light into the light guide 209. Finally, as shown in FIG. 3I, the protective layer 213 is formed above the third wiring layer 207, and the color filter layer 210 and microlenses 211 are then formed thereupon.

Manufacturing the image sensor in this manner makes it possible to embed materials having different dielectric constants in the light guide 208 of the OB pixel 201 and the light guide 209 of the active pixel 202. Selecting the materials makes it possible to realize similar degrees of parasitic capacitance in the OB pixel 201 and the active pixel 202, thereby making it possible to reduce OB level differences.

Figure 4:
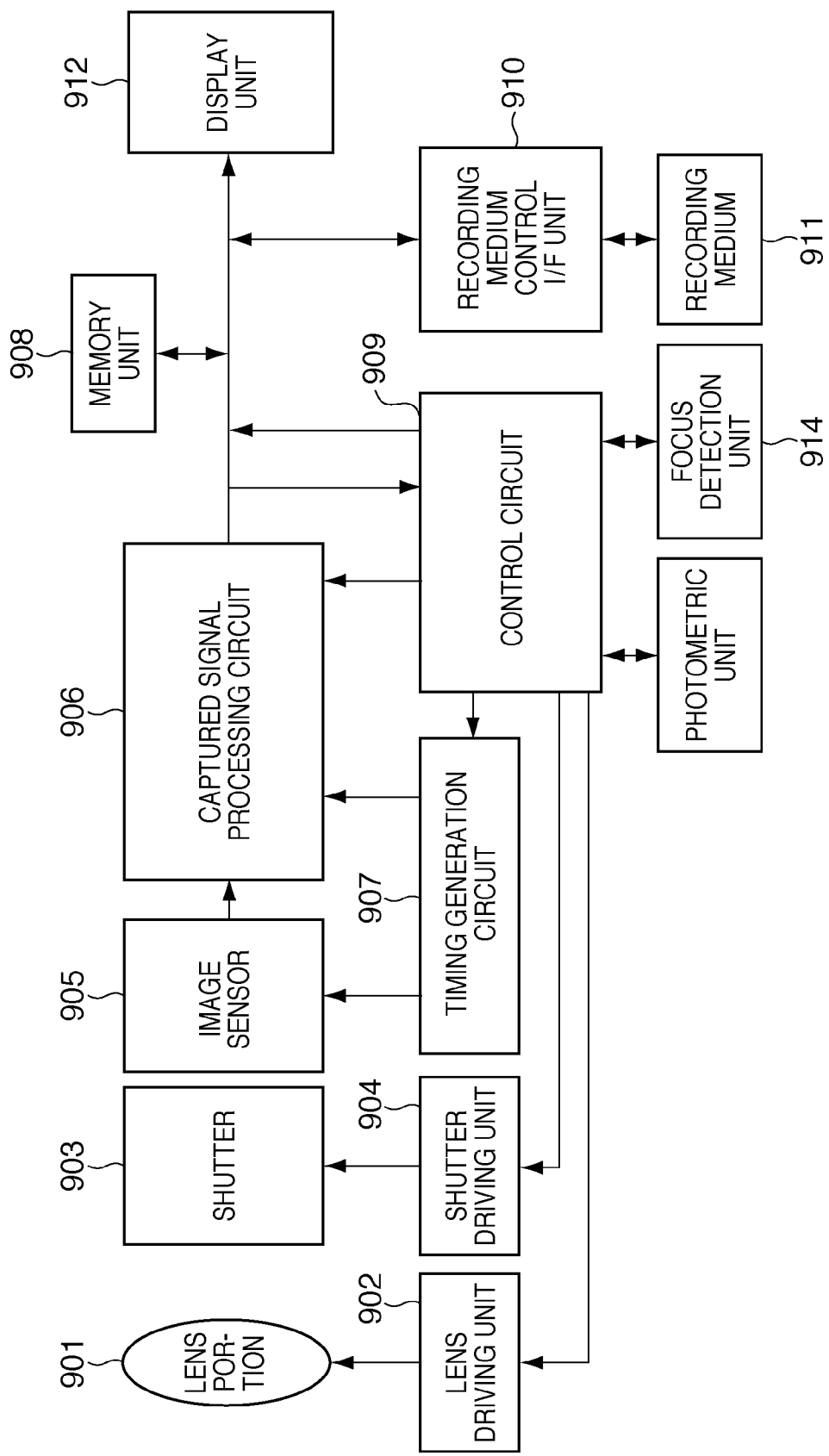
FIG. 4 is a diagram illustrating the configuration of an image capturing apparatus according to an embodiment of the present invention.

An example in which the image sensor described thus far is applied in a digital camera serving as an image capturing apparatus shall be described in detail based on FIG. 4.

In FIG. 4, 901 indicates a lens portion that forms an optical image of an object on an image sensor 905; zoom control, focus control, aperture control, and so on are carried out by a lens driving unit 902. 903 indicates a mechanical shutter controlled by a shutter driving unit 904. 905 indicates the image sensor that imports the object image formed by the lens portion 901 as an image signal, whereas 906 indicates a captured signal processing circuit that performs various corrections on the image signal outputted from the image sensor 905, performs data compression, and so on. 907 indicates a timing generation circuit that outputs various types of timing signals to the image sensor 905 and the captured signal processing circuit 906; 909 indicates a control circuit that performs various types of computations and controls the image capturing apparatus as a whole; and 908 indicates a memory for temporarily storing image data. 910 indicates a recording medium control I/F unit for recording to or reading out from a recording medium 911; 911 indicates a removable recording medium such as a semiconductor memory or the like for recording or reading out image data; and 912 indicates a display unit for displaying various types of information, captured images, or the like.

Next, operations of the digital camera configured as described thus far at the time of capturing shall be described.

When the main power is turned on, the power of a control system is turned on as well, and furthermore, the power to the capturing system circuitry, such as the captured signal processing circuit 906, is also turned on. After this, when a release button (not shown) is depressed, a high-frequency component of a signal outputted from a focus detection unit 914 is extracted, and the control circuit 909 performs computations as to whether or not an object is in focus. After this, the lens portion 901 is driven by the lens driving unit 902, and it is determined whether or not the lens portion 901 is focused; if it has been determined that the lens portion 901 is not focused, the focus detection is carried out after driving the lens portion once again.

Then, after the lens portion has been confirmed as being in focus, capturing operations are commenced. When the capturing operations are finished, an image signal outputted from the image sensor 905 undergoes image processing in the captured signal processing circuit 906, and is then written into the memory 908 by the control circuit 909. The data accumulated in the memory 908 is recorded in the removable recording medium 911 such as a semiconductor memory or the like under the control of the control circuit 909, via the recording medium control I/F unit 910. The data may also be inputted directly to a computer or the like via an external I/F unit (not shown) whereupon the images can then be edited.

While the present invention has been described with reference to an exemplary embodiment, it is to be understood that the invention is not limited to the disclosed exemplary embodiment. The scope of the following claims is to be accorded the broadest interpretation so as to encompass all such modifications and equivalent structures and functions.

This application claims the benefit of Japanese Patent Application No. 2009-090485, filed Apr. 2, 2009, which is hereby incorporated by reference herein in its entirety.

The invention claimed is:

1. An image sensor comprising:
a plurality of photoelectric conversion pixels each of which includes a photoelectric conversion element, multiple wiring layers positioned above the photoelectric conversion element, interlayer insulation films formed among the multiple wiring layers, and a light guide formed of a first material in the interlayer insulation films; and
a plurality of light-shielded pixels each of which includes a photoelectric conversion element, multiple wiring layers positioned above the photoelectric conversion element, interlayer insulation films formed among the multiple wiring layers, a light guide formed of a second material in the interlayer insulation films, and a light-shielding layer which is formed of a wiring layer among the multiple wiring layers, formed above the light guide, that shields the photoelectric conversion element and the light guide,
wherein a dielectric constant of the first material is set to a value different from that of the second material so as to reduce a difference between parasitic capacitances of the light-shielded pixels and the photoelectric conversion pixels.

2. The image sensor according to claim 1, wherein the dielectric constant of the second material is lower than the dielectric constant of the first material.

3. A method for manufacturing an image sensor, the image sensor comprising a plurality of photoelectric conversion pixels whose photoelectric conversion elements are not optically shielded and a plurality of light-shielded pixels whose photoelectric conversion elements are optically shielded, the method comprising:
a first step of forming interlayer insulation films among multiple wiring layers;
a second step of forming light guides in the interlayer insulation films of the light-shielded pixels after the first step;
a third step of forming light guides in the interlayer insulation films of the photoelectric conversion pixels after the second step; and
a fourth step of forming each of the light-shielding layers on the light-shielded pixel by a wiring layer among the multiple wiring layers after the third step,
wherein the light guides of the photoelectric conversion pixels are formed of a first material and the light guides of the light-shielded pixels are formed of a second material, and a dielectric constant of the first material is set to a value different from that of the second material so as to reduce a difference between parasitic capacitances of the light-shielded pixels and the photoelectric conversion pixels.

4. The method according to claim 3, wherein the dielectric constant of the second material is lower than the dielectric constant of the first material.

5. The image sensor according to claim 1, wherein each of the light-shielded pixels includes a micro lens.

6. The image sensor according to claim 1, wherein each of the light-shielded pixels includes a color filter.

7. The method according to claim 3, wherein each of the light-shielded pixels includes a micro lens.

8. The method according to claim 3, wherein each of the light-shielded pixels includes a color filter.

9. The image sensor according to claim 1, wherein the wiring layer which forms the light-shielding layer is farthest from the photoelectric conversion element among the multiple wiring layers.

10. The method according to claim 3, wherein the wiring layer which forms the light-shielding layer is farthest from the photoelectric conversion element among the multiple wiring layers.

* * * * *